(12) United States Patent
Chiu et al.

(10) Patent No.: US 7,948,292 B1
(45) Date of Patent: May 24, 2011

(54) METHOD AND APPARATUS FOR BUFFERING SIGNALS IN VOLTAGE DOMAINS

(75) Inventors: Robert Chiu, Markham (CA); Denitza Tchoevska, Toronto (CA); Parissa Najdesamii, Markham (CA); Mark H. Sternberg, Toronto (CA)

(73) Assignee: ATI Technologies ULC, Markham, Ontario (CA)

( * ) Notice: Subject to any disclaimer, the term of this patent is extended or adjusted under 35 U.S.C. 154(b) by 44 days.

(21) Appl. No.: 12/133,697

(22) Filed: Jun. 5, 2008

Related U.S. Application Data

(60) Provisional application No. 60/976,181, filed on Sep. 28, 2007.

(51) Int. Cl.
*H03L 5/00* (2006.01)
(52) U.S. Cl. .............................. 327/333; 326/62; 326/80
(58) Field of Classification Search .............. 326/62–63, 326/80–81; 327/306, 333
See application file for complete search history.

(56) References Cited

U.S. PATENT DOCUMENTS

| | | | | |
|---|---|---|---|---|
| 7,119,578 B2 * | 10/2006 | Correale et al. | ................ | 326/81 |
| 7,202,700 B2 * | 4/2007 | Isono | ............................... | 326/81 |
| 7,305,639 B2 * | 12/2007 | Floyd et al. | ....................... | 716/5 |
| 7,365,573 B2 * | 4/2008 | Okada | ............................ | 326/86 |
| 7,489,178 B2 * | 2/2009 | Yeung | ........................... | 327/333 |
| 7,590,962 B2 * | 9/2009 | Frenkil et al. | ................... | 716/11 |

\* cited by examiner

*Primary Examiner* — Dinh T. Le
(74) *Attorney, Agent, or Firm* — Vedder Price P.C.

(57) ABSTRACT

An integrated circuit includes first and second voltage domains. The first voltage domain is associated with a positive voltage supply grid and the second voltage domain is associated with a selectably on voltage supply grid. A switch is used to selectably switch on and off the selectably on voltage supply grid to power the second voltage domain. A buffer cell cluster of at least on initial buffer cell and a pair of insulator cells is coupled to the positive voltage supply grid electrically independent of the nodes of a switch and is capable of buffering a feed-through signal having a logic one voltage level defined substantially at the voltage level of the positive voltage supply grid. The buffer cell cluster has two distal ends. buffer cell cluster, at one distal end, is coupled to a first insulator cell of the pair of cells while, at the other distal end, the buffer cell cluster is coupled to a second insulator cell of the pair of the cells.

25 Claims, 9 Drawing Sheets

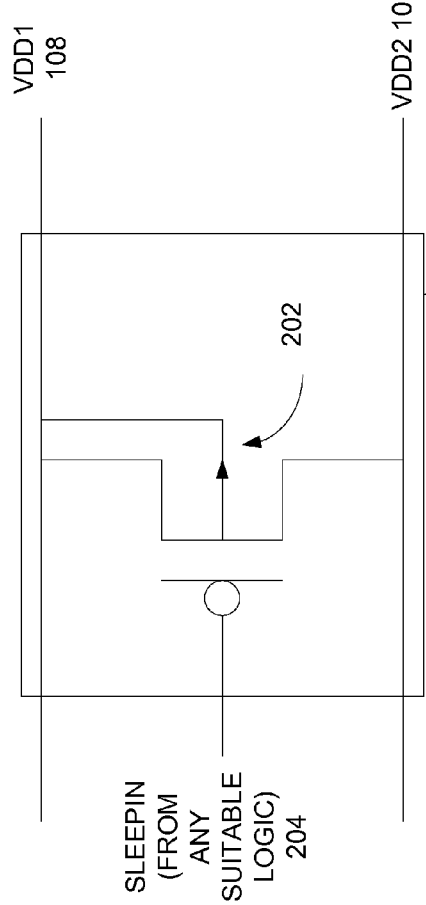
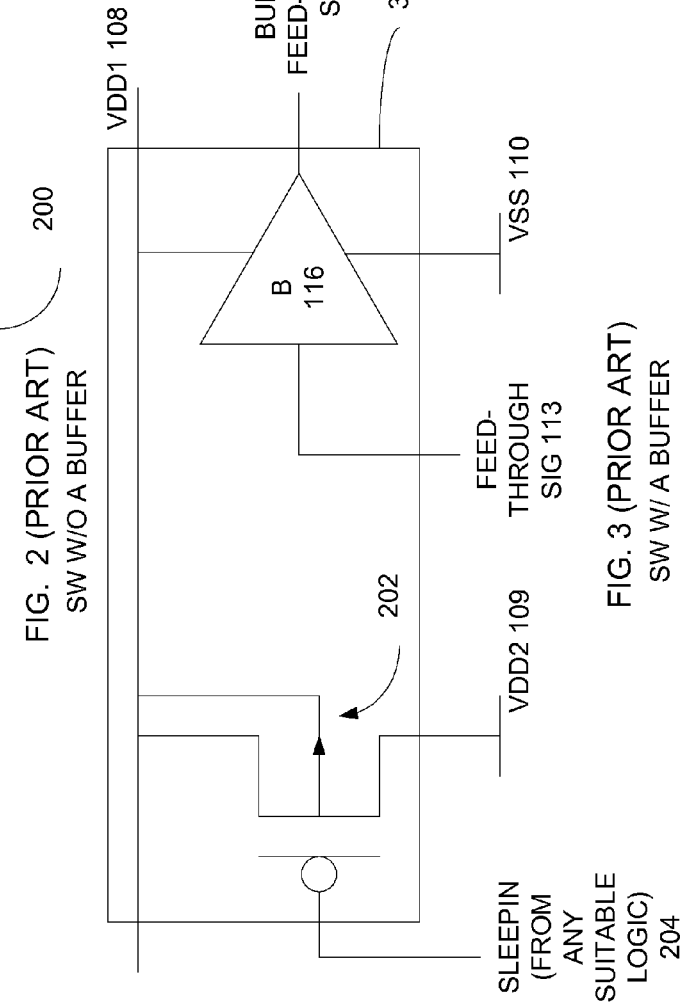
FIG. 2 (PRIOR ART)
SW W/O A BUFFER
FIG. 3 (PRIOR ART)
SW W/ A BUFFER

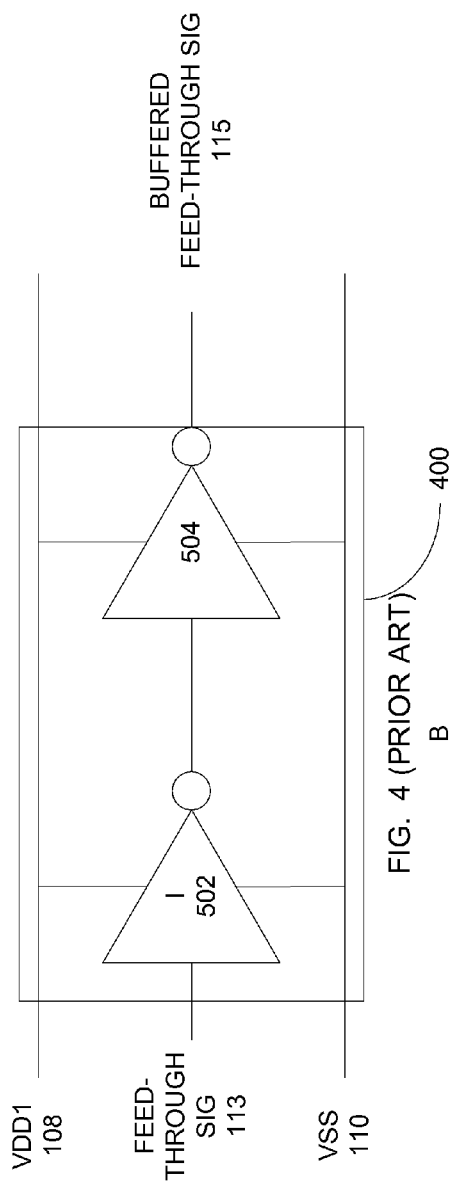
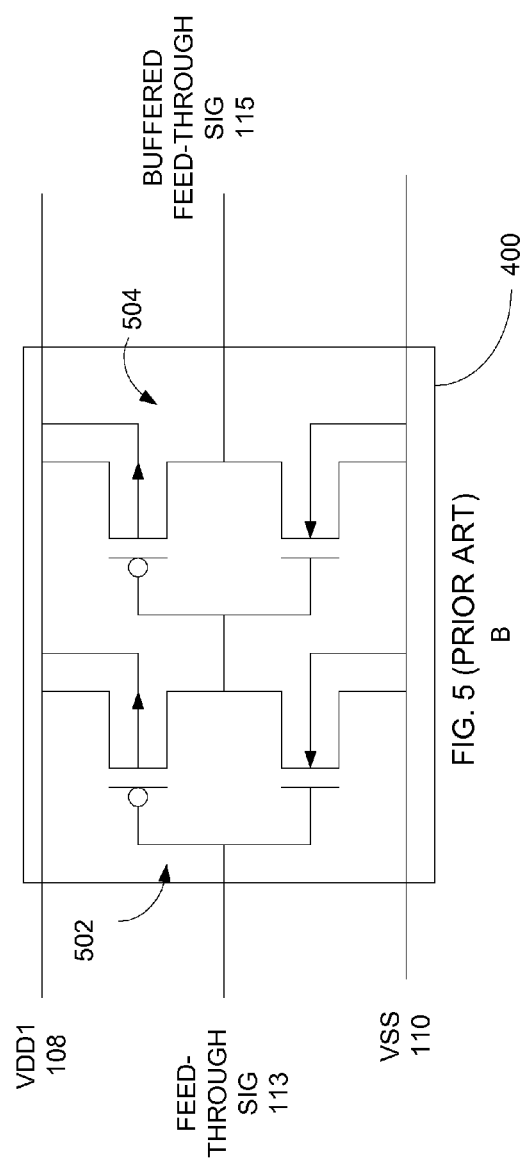

METHOD AND APPARATUS FOR BUFFERING SIGNALS IN VOLTAGE DOMAINS

CROSS-REFERENCE TO RELATED APPLICATION

This application claims priority to the provisional patent application having Application No. 60/976,181, filed Sep. 28, 2007, having inventors Robert Chiu et al. and owned by instant assignee, for a METHOD AND APPARATUS FOR BUFFERING SIGNALS IN VOLTAGE DOMAINS.

FIELD OF THE INVENTION

The present disclosure generally relates to integrated circuits having more than one voltage domain and that are capable of buffering signals in the integrated circuit, and more particularly, to buffering signals in a voltage domain of an integrated circuit that is capable of being powered down independent of another voltage domain of the integrated circuit.

BACKGROUND OF THE INVENTION

As the explosion of electronic devices such as televisions, computers (i.e., anything that computes), monitors, mobile phones, personal digital assistants, handheld devices, etc. continue to push the technological envelope with respect to their ability to perform tasks quicker and better than each previous generation, size and power considerations remain important to both the consumer and the circuit designer. The two considerations often go hand-in-hand as a decrease in size of a handheld device, for instance, may require a battery source that is limited in physical size and therefore may require more frequent charging or replacement when compared to a similarly constructed battery having similar electrical properties but being larger in size. Others having ordinary skill in the art will also appreciate other relationships (e.g., between size and power) of integrated circuit components.

It is well known that integrated circuits supplied with more than one voltage grid are said to have more than one voltage domain, wherein each voltage domain is associated with the voltage level provided by its associated voltage grid. It is further well known to selectively power up or power down a voltage domain by selectively providing voltage to the voltage domain's voltage grid. Accordingly, voltage domains may also be referred to as power domains. It is also well known that an integrated circuit's multiple voltage domains may have voltage levels at the same or different values.

FIG. 1 illustrates a block diagram of one example of an integrated circuit 100 that conceptually shows features relevant to the present disclosure. The integrated circuit 100 includes three voltage domains: a first voltage domain 102, a second voltage domain 104 and a third voltage domain 106. The first voltage domain 102 and the third voltage domain 106 are associated with the positive voltage supply grid VDD1 108 while the second voltage domain 104 is associated with another voltage supply grid VDD2 109. For purposes of this example, the another voltage supply grid VDD2 109 is a selectably on voltage supply grid VDD2 that has a voltage level at or substantially at the voltage level associated with the positive voltage supply grid VDD1 108 when the selectably on voltage supply grid VDD2 109 is on. One or more switching cells (not specifically shown) having switch logic (e.g., a PMOS transistor) associated therewith are coupled between the positive voltage supply grid VDD1 108 and the selectably on voltage supply grid VDD2 109 to control whether the selectably on voltage supply grid VDD2 109 is on or off. It is contemplated that the another voltage supply grid VDD2 109 may be any other voltage grid that is always on (as compared to being selectably on) and/or that is at a different voltage level than the voltage level associated with the positive voltage supply grid VDD1 108. As used herein, the term switch logic is synonymous with the term switch and refers to any suitable integrated circuit component(s) capable of performing a switching function as known in the art.

One having ordinary skill in the art recognizes that integrated circuits include standard cells that include logic designed, programmed or programmable to perform a particular circuit function. As is recognized "logic" may include any suitable combination of integrated circuit components (e.g., transistors). It is further recognized that standard cells in an integrated circuit are generally found in the lower layers of an integrated circuit (e.g., in the substrate region and in the lower metal layers). Returning to FIG. 1, standard cells (not specifically shown) within the first voltage domain 102 of the integrated circuit 100 are coupled to the positive voltage supply grid VDD1 108. Standard cells (not specifically shown) in the second voltage domain 104 of the integrated circuit 100 are coupled to the selectably on voltage supply grid VDD2 109. Similarly, standard cells (not specifically shown) in the third voltage domain 106 of the integrated circuit 100 are coupled to the positive voltage supply grid VDD1 108.

The positive voltage supply grid VDD1 108 powers the standard cells in the first and third voltage domains 102 and 106 of the integrated circuit 100 by supplying the positive voltage level associated with the positive voltage supply grid VDD1 108 to each of the standard cells. Similarly, the selectably on voltage supply grid VDD2 109 of the second voltage domain 104 of the integrated circuit 100 powers the standard cells in the second voltage domain 104 of the integrated circuit 100. Because the selectably on voltage supply grid VDD2 109 is a voltage supply grid that is capable of being powered up and powered down, the standard cells in the second voltage domain 104 are also capable of being selectively powered up and powered down.

It is further recognized that additional cell types besides the standard cell as introduced above are used in integrated circuits to perform certain functions. For example, the switching cell (also introduced above) and the buffer cell (described in further detail below) are additional types of cells used in an integrated circuit.

Implicit in the above discussion is the need and use of a negative voltage supply grid. For example, many integrated circuit components require one or more terminals coupled to ground or a sufficiently low voltage source or supply. FIG. 1 illustrates such a negative voltage supply grid as negative voltage supply grid VSS 110. Generally, each of the voltage supply grids (positive and negative) in an integrated circuit are associated with the upper-most metal layers, are arranged in a grid (as further discussed below) and are coupled to cells and/or power-ground rails (associated with the middle or lower layers of the integrated circuit) using a piece of metal called a via stack. The via stack provides electrical connectivity between the associated voltage supply grid and to the cells of the integrated circuit. As is known, power-ground rails (vertical or horizontal) are used to carry voltage from cell to cell without having to tap the voltage supply grid using via stacks for each cell. Each time the term "via stack" is used throughout this disclosure, it is recognized and contemplated that any other suitable electrical conduit or wire is and may be capable of similarly providing this electrical connectivity.

The integrated circuit 100 of FIG. 1 illustrates a transmitting standard cell 112 associated with or located in the first voltage domain 102 and a receiving standard cell 114 associated with or located in the third voltage domain 106. The transmitting standard cell 112 is a standard cell that is capable of transmitting a feed-through signal 113 through the second voltage domain VDD2 104 of the integrated circuit 100 to the third voltage domain 106 of the integrated circuit 100 to, for example, the receiving standard cell 114. The feed-through signal 113 is so named because it is fed through another voltage domain (e.g., voltage domain 102). The feed-through signal 113 has a logic one voltage level at or substantially at the voltage level of the positive voltage supply grid VDD1 108 and represents any suitable information for transmission from one standard cell to another standard cell in the integrated circuit 100. The information carried on feed-through signal 113 is carried on a metal path or any other suitable transmission conduit or wire capable of electrical connectivity (not specifically shown). Although FIG. 1 shows a specific example of feed-through signal 113, it is known that feed-through signals may be fed through any number of different voltage domains and may be received by any number of suitable standard cells.

It is recognized that the due to physical parameters such as length of the transmission path from the transmitting standard cell 112 to the receiving standard cell 114, etc., the signal strength of the feed-through signal 113 may be attenuated or otherwise adversely affected by noise and/or other electromagnetic effects if it is not buffered up to or substantially close to the voltage level of the feed-through signal's 113 logic one voltage level. By buffering the feed-through signal 113, the information conveyed on the feed-through signal 113 may be more reliable than it would be otherwise. It is recognized that one or more buffers in any suitable cell(s) (e.g., an independent buffer cell or a switching cell that includes buffer) may be coupled between the transmitting standard cell 112 and the receiving standard cell 114 to buffer the feed-through signal 113. As used herein, the term buffer is synonymous with the term buffer logic and refers to any suitable combination of integrated circuit components capable of performing buffering functions as known in the art.

It is generally desirable to buffer feed-through signals 113 within the second voltage domain 104 as it is at this location where the signal strength often needs to be improved for accurate transmission of information to the receiving standard cell (e.g., receiving standard cell 114). Using the example of FIG. 1, this poses a problem because the second voltage domain 104 is capable of being selectively turned on and off. If a buffer is implemented in the second voltage domain 104 such that it is powered by the selectably on voltage power grid VDD2 109, the buffer may not be operational (i.e., turned on) when needed.

To address this problem, it is known to couple a buffer such as buffer 116 to the positive voltage supply grid VDD1 108 as shown in FIG. 1. The implementation details regarding the coupling of the positive voltage supply grid VDD1 108 (associated with the first voltage domain 102) to buffer 116 associated with or located in the second voltage domain 104 is discussed below. As is known, buffers may be implemented in a stand-alone cell called a buffer cell or may be implemented in a switching cell. However, prior art solutions either limited the location of buffers to specific locations and thereby fixed the number of available buffers in the second voltage domain 104 or required the use of or dependency upon at least one switching cell as discussed below. Following these prior art methodologies was costly as it limited the locations where circuit designers placed buffers and resulted in limiting the number of feed-through signals that could be fed through and buffered in a second voltage domain like second voltage domain 104 of integrated circuit 100.

FIG. 2 illustrates a schematic block diagram of one example of a switching cell 200 in accordance with the prior art. Switching cell 200 includes switching logic 202 without a buffer. Switching logic 202 may be any suitable logic capable of providing a switching function. In this example, switching logic 202 is implemented using a PMOS transistor. Switching logic 202 is coupled between the positive voltage supply grid VDD1 108 and the selectably on voltage supply grid VDD2 109. Switching logic 202 receives a sleepin signal 204 from any suitable logic, and based on the sleepin signal 204, switching logic 202 is capable of turning on or off the selectably on voltage supply grid VDD2 109. In other words, sleepin signal 204 is any suitable signal, information or data (e.g., but not limited to voltage levels) that represents what state (i.e., on or off) within which switching logic 202 should operate. In one embodiment, when the sleepin signal 204 is equivalent to a logic 0, switching logic 202 goes "to sleep". The logic that provides the sleepin signal 204 may be from any suitable source such as a processing unit (e.g., a central processing unit(s)) in a computing device, or any other functional cell on the same or different integrated circuit in which the switching cell is located.

FIG. 3 illustrates a schematic block diagram of another example of a switching cell 300 in accordance with the prior art. Switching cell 300 includes switching logic 202 and buffer logic 116. Buffer logic 116 is coupled between the positive voltage supply grid VDD1 108 and the negative voltage supply grid VSS 110 and operates the same as provided above with reference to FIG. 1. Switching logic 202 operates as described above with respect to FIG. 2.

FIG. 4 illustrates a schematic block diagram of one example of a buffer cell 400 in accordance with the prior art. Buffer cell 400 implements buffer logic 116 as two inverters I 502, 504 coupled in series and is coupled between the positive voltage supply grid VDD1 108 and the negative voltage supply grid VSS 110. FIG. 5 illustrates a more detailed schematic block diagram of the buffer cell 400 of FIG. 4 and specifically shows each inverter I 502, 504 implemented using CMOS transistors as is known in the art.

FIG. 6 illustrates a top plan view 600 of a portion of integrated circuit 100 of FIG. 1 in accordance with the prior art. FIG. 6 illustrates positive voltage supply grid VDD1 108 in relative relation to negative voltage supply grid VSS 110 and selectably on voltage supply grid VDD2 109. In this illustration, positive voltage supply grid VDD1 108 includes a plurality of metals that are substantially parallel to each other in a first direction (e.g., in a substantially vertical direction) in addition to a plurality of metals that are substantially parallel to one another in an orthogonal direction with respect to the aforementioned plurality of illustrated metals in the first direction (e.g., in a substantially horizontal direction). One having ordinary skill in the art will recognize that each of the negative voltage supply grid VSS 110 and the selectively on voltage supply grid VDD2 109 is illustrated in a similar manner. As further illustrated, the selectably on voltage supply grid VDD2 109 overlaps a portion of both the positive voltage supply grid VDD1 108 and the negative voltage supply grid VSS 110. In FIG. 6, this area of overlap is indicated by area 104 and indicates the location of the second voltage domain 104 of the integrated circuit 100 of FIG. 1. The area of non-overlap indicates the location of the first voltage domain 102. The metals associated with the positive and negative voltage supply grids VDD1 108 and VSS 110 are illustrated larger than the metals associated with the selectively on positive voltage supply grid VDD2 109 for purposes of clarity and to further illustrate that these pluralities of metals are typically (but not necessarily) of a larger size than the metals associated with the selectably on voltage supply grid VDD2 109 to avoid adverse switching effects such as a large IR drop.

In prior art cell layouts where the substantially horizontal members of each of the power supply grids VDD1 108, VDD2 109 and VSS 110 are primarily used to distribute the associated voltage level of the grid throughout integrated circuit 100, the substantially vertical members of each power supply grid are primarily used to provide electrical connectivity to cells within corresponding and respective voltage domains. According, the substantially horizontal members are typically located in a higher metal layer than the corresponding substantially vertical members of the power supply grids. The opposite is true for prior art cell layouts that use substantially horizontal members for providing electrical connectivity to cells with corresponding and respective voltage domains and use substantially vertical members for distribution throughout the integrated circuits. Via stacks are used to couple vertical and horizontal members of like voltage supply grids.

In prior art cell layouts where the substantially horizontal members of each of the voltage supply grids VDD1 108, VDD2 109 and VSS 110 are primarily used to distribute the associated voltage level of the grid throughout the integrated circuit 100, such as that shown in FIG. 6, switching cells without buffers 200 and switching cells with buffers 300 are generally placed or otherwise located beneath the substantially vertical metals highlighted by areas 606 and coupled between the substantially vertical members of positive voltage supply grid VDD1 108 and the selectably on voltage supply grid VDD2 109 using via stacks. It is further recognized that the ideal location for placement of a switching cell with or without a buffer 200, 300 is below the intersection of the substantially vertical members of both the positive voltage supply grid VDD1 108 and the selectably on voltage supply grid VSS 109 with the substantially horizontal members of the same grids as indicated by the area labeled with reference numeral 608. This location is considered ideal to the extent that the distance from the substantially horizontal positive voltage supply grid VDD1 108 (for distribution) to the substantially vertical positive voltage supply grid VDD1 108 (for cells) to the substantially vertical selectably on voltage supply grid VDD2 109 (for cells) to the substantially horizontal selectably on voltage supply grid VDD2 109 (for distribution) is minimized.

A first prior art solution to adding buffers to the layout described above placed a switching cell having buffer logic 300 in one or more consecutive rows of the integrated circuit layout along the columns highlighted by areas 606 of FIG. 6. Accordingly, this prior art solution formed a column of switching cells with buffer logic 300 substantially along or substantially beneath the substantially vertical members of the positive and selectably on voltage supply grids VDD1 108 and VDD2 109 ("in the columns 606"). The space (identified by reference numeral 609) between each column 606 of switching cells is filed with other cells, namely standard cells associated with or located in the second voltage domain 104. In this solution, numerous via stacks were used to tap the appropriate voltage supply grid (e.g., VDD1 for switching cells 300 and VDD2 for standard cells) and vertical power-ground rails were used to couple one or more adjacent cells vertically when said adjacent cells are not coupled to said associated voltage supply grid. Although this was advantageous to the extent that it provided buffers for feed-through signals in the second voltage domain 104 of the integrated circuit 100, it limited the number of feed-through signals that could be passed through a particular area to the number of available rows as the only buffers available were located in switching cells 300.

A second prior art solution to adding buffers to the layout described above recognized that switching logic was not needed in every row along columns 606. In place of certain switching cells with buffer logic 300, this solution placed buffer cells 400 in the columns 606. Similar to the first solution, the spaces 609 in between columns 606 is filed with other cells, namely standard cells associated with or located in the second voltage domain 104 and all cells are coupled vertically to the respective voltage supply grid. While this second solution was an improvement over the first solution in that it offered a savings in area (due to the replacement of switching cells with buffer logic 300 with buffer cells 400), the solution retained a fixed number of feed-though buffers 116 and presented circuit designers with the possibility of running out of buffers in high congestion areas of feed-through signals.

A third prior art solution to adding buffers to the layout described above required the use of pairs of switching cells and created an area for the placement of buffers therebetween. For example, a switching cell (with or without buffer logic 200, 300) is placed in a row of the integrated circuit layout in a first column 606 and a corresponding switching cell of the pair of switching cells is placed in a second column 606 in the same row of the integrated circuit layout. It is recognized that the adjectives "first" and "second" are used to merely distinguish columns of columns 606. For the space 609 in between corresponding pairs of switching cells (i.e., the space along the same row), a horizontal power-ground rail at the voltage level of the positive voltage supply grid VDD1 108 is placed to supply buffer cells 400 and other cells that do not require the selectively on voltage supply grid VDD2. In other words, each pair of switching cells forms a boundary using a first switching cell of the pair of switching cells as a left-most boundary and using a second switching cell of the pair of switching cells as a right-most boundary. Therebetween, buffer cells 400 are located. This solution, however, does not permit the placement of standard cells associated with the selectably on voltage supply grid VDD2 in the space and corresponding rows that have a pair of switching cells in columns 606. In space and rows that do not have pairs of switching cells in columns 606, any type of standard cell (or other cell) may be placed as recognized by those in the art. Although this solution allowed for the expansion of buffer cells 400 into rows, a buffer cell 400 could only be placed in a row of an integrated circuit layout also having a pair of switching cells in that same row to selectively switch on and off the selectably on power supply voltage grid VDD2 109. In other words, buffers in this solution are dependent on switching cells 200, 300. Thus, this solution also limited the number of buffers available in an integrated circuit by the number of switching cells present and the number of buffers located in the space and corresponding row between pairs of switching cells. The solution also wasted space by not permitting the placement of standard cells in the space and corresponding row between pairs of switching cells.

Accordingly, a need exists for an integrated circuit having buffer cells located in more convenient and numerous locations so that more efficient buffering of feed-through signals may occur. A need further exits for such an integrated circuit having these advantages while also having a grid arrangement of voltage supply grids.

BRIEF DESCRIPTION OF THE DRAWINGS

The invention will be more readily understood in view of the following description when accompanied by the below figures and wherein like reference numerals represent like elements.

FIG. 2 illustrates a schematic block diagram of one example of a switching cell in accordance with the prior art.

FIG. 3 illustrates a schematic block diagram of another example of a switching cell in accordance with the prior art.

FIG. 4 illustrates a schematic block diagram of one example of a buffer cell in accordance with the prior art.

FIG. 5 illustrates a more detailed schematic block diagram of the buffer cell of FIG. 4.

DETAILED DESCRIPTION

Figure 1:
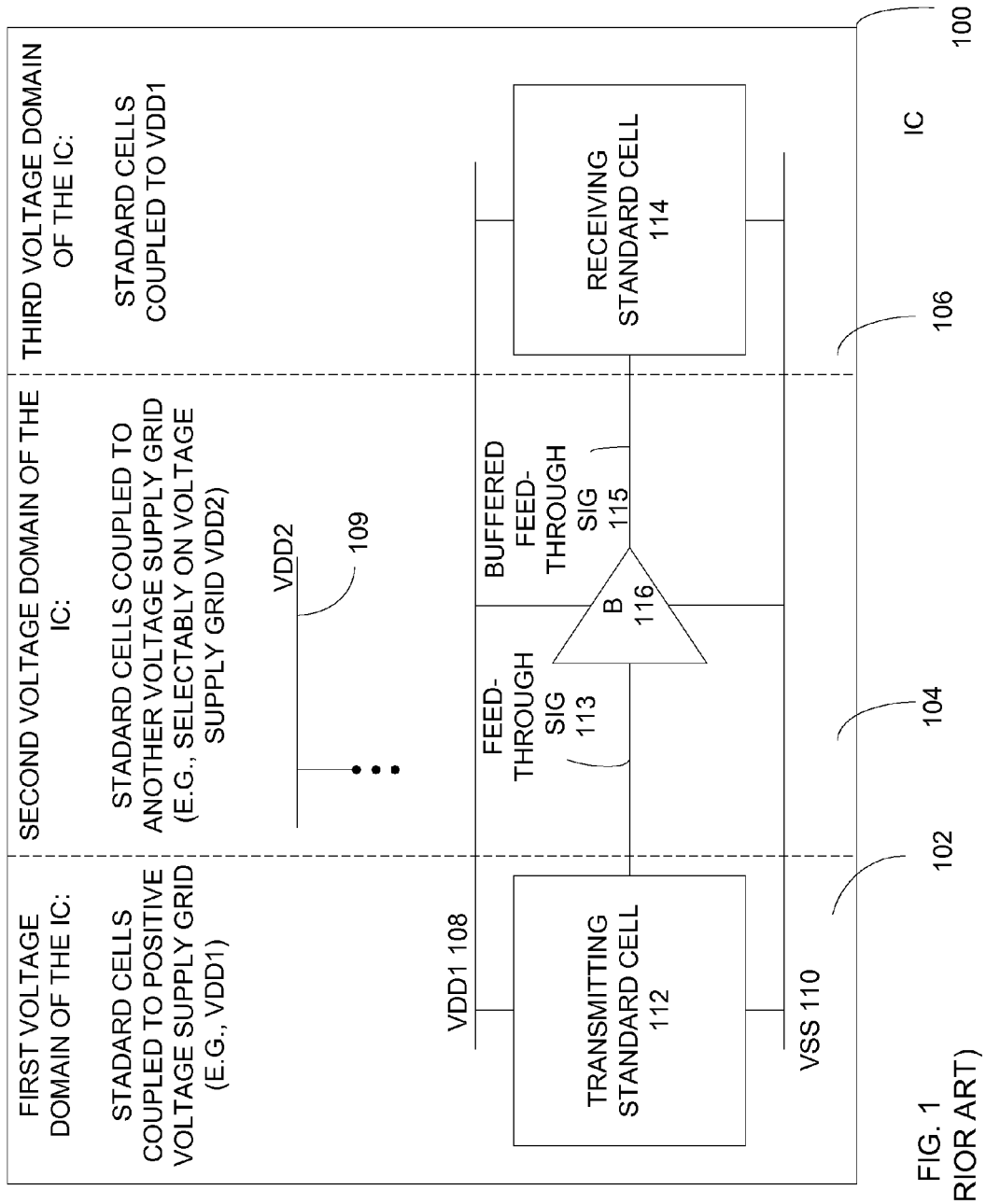
FIG. 1 illustrates a block diagram of one example of an integrated circuit in accordance with the prior art.

Generally, the present disclosure provides an integrated circuit and memory for designing an integrated circuit having buffer cells to improve buffering of feed-through signals in a voltage domain. The integrated circuit of the present disclosure includes at least first and second voltage domains. The first voltage domain is associated with a positive voltage supply grid while the second voltage domain is associated with a selectably on voltage supply grid. A switch having a first and second node is used to selectably switch on and off the selectably on voltage supply grid to power the second voltage domain. A buffer cell cluster of at least one initial buffer cell and a pair of insulator cells is coupled to the positive voltage supply grid and is electrically independent of the nodes of the switch and is capable of buffering a feed-through signal having a logic one voltage level defined substantially at the voltage level of the positive voltage supply grid. In one embodiment, the buffer cell cluster has two distal ends such that the buffer cell cluster, at one distal end, is coupled to a first insulator cell of the pair of insulator cells. At the other distal end, the buffer cell cluster is coupled to a second insulator cell of the pair of insulator cells.

In one embodiment, the integrated circuit also includes a plurality of standard cells associated with the first voltage domain such that they are powered by the positive voltage supply grid. The plurality of standard cells includes at least one transmitting standard cell that generates the feed-through signal. The integrated circuit, in one embodiment, includes a plurality of standard cells associated with the second voltage domain such that they are powered by the selectably on voltage supply grid. The standard cells of each of the first and second voltage domains perform one or more functions of the integrated circuit.

In one embodiment, the integrated circuit also includes a third voltage domain that is also associated with the positive voltage supply grid. A plurality of standard cells are associated with the third voltage domain such that they are powered by the positive voltage supply grid. The plurality of standard cells associated with the third voltage domain includes a receiving standard cell that receives the buffered feed-through signal.

With such an integrated circuit, the needs provided above are met for at least the reason that designers are provided greater flexibility in the number and placement of buffer cells in an integrated circuit capable of supporting feed-through signals in a voltage domain.

In the following detailed description, numerous specific details are set forth in order to provide a thorough understanding of the present disclosure. It will be apparent to one of ordinary skill in the art, however, that these specific details need not be used to practice the present disclosure. In other instances, well-known structures, interfaces and processes have not been shown or described in detail in order not to unnecessarily obscure the present invention.

Figure 6:
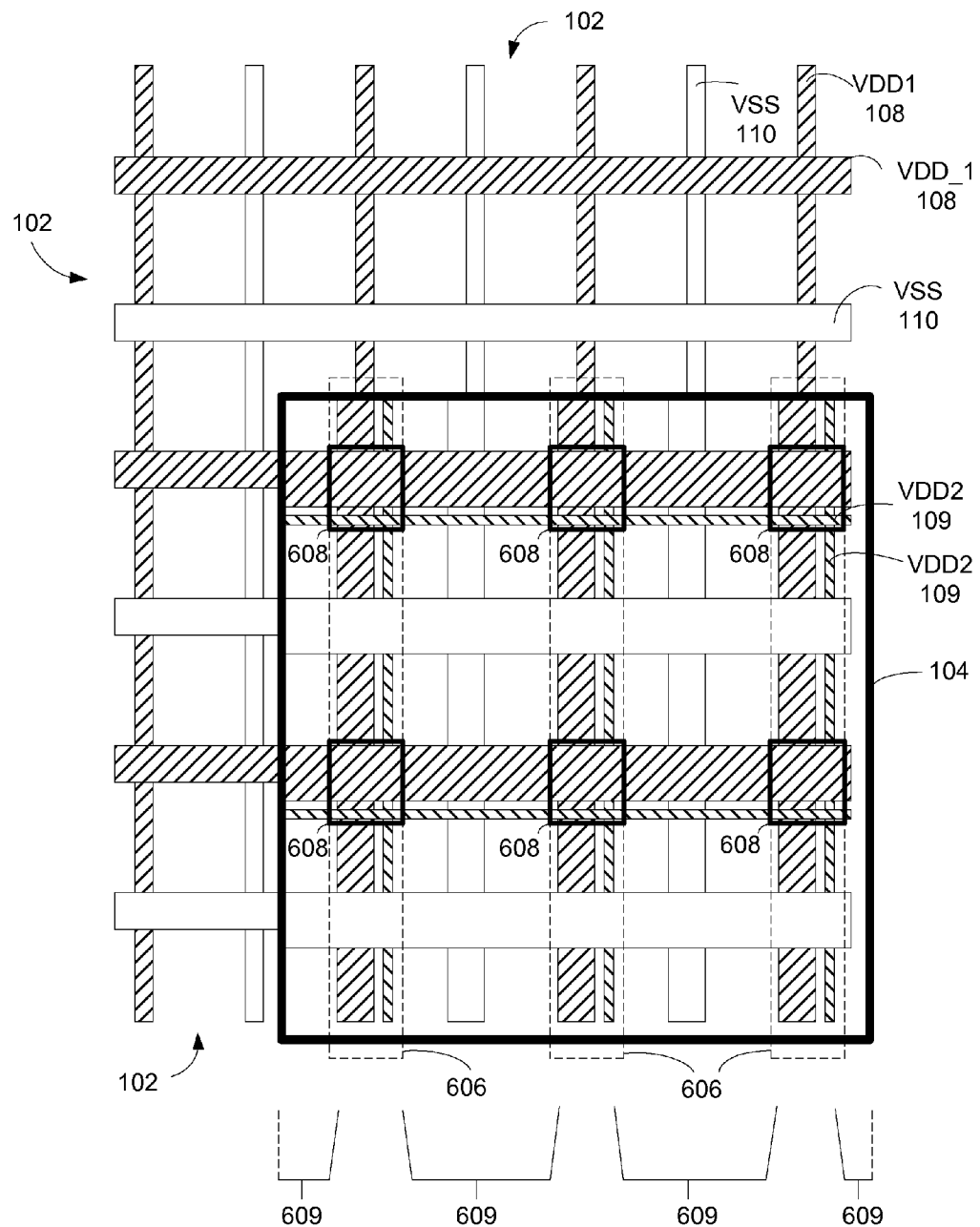
FIG. 6 illustrates a top plan view of a portion of the integrated circuit of FIG. 1 in accordance with the prior art.
Figure 7:
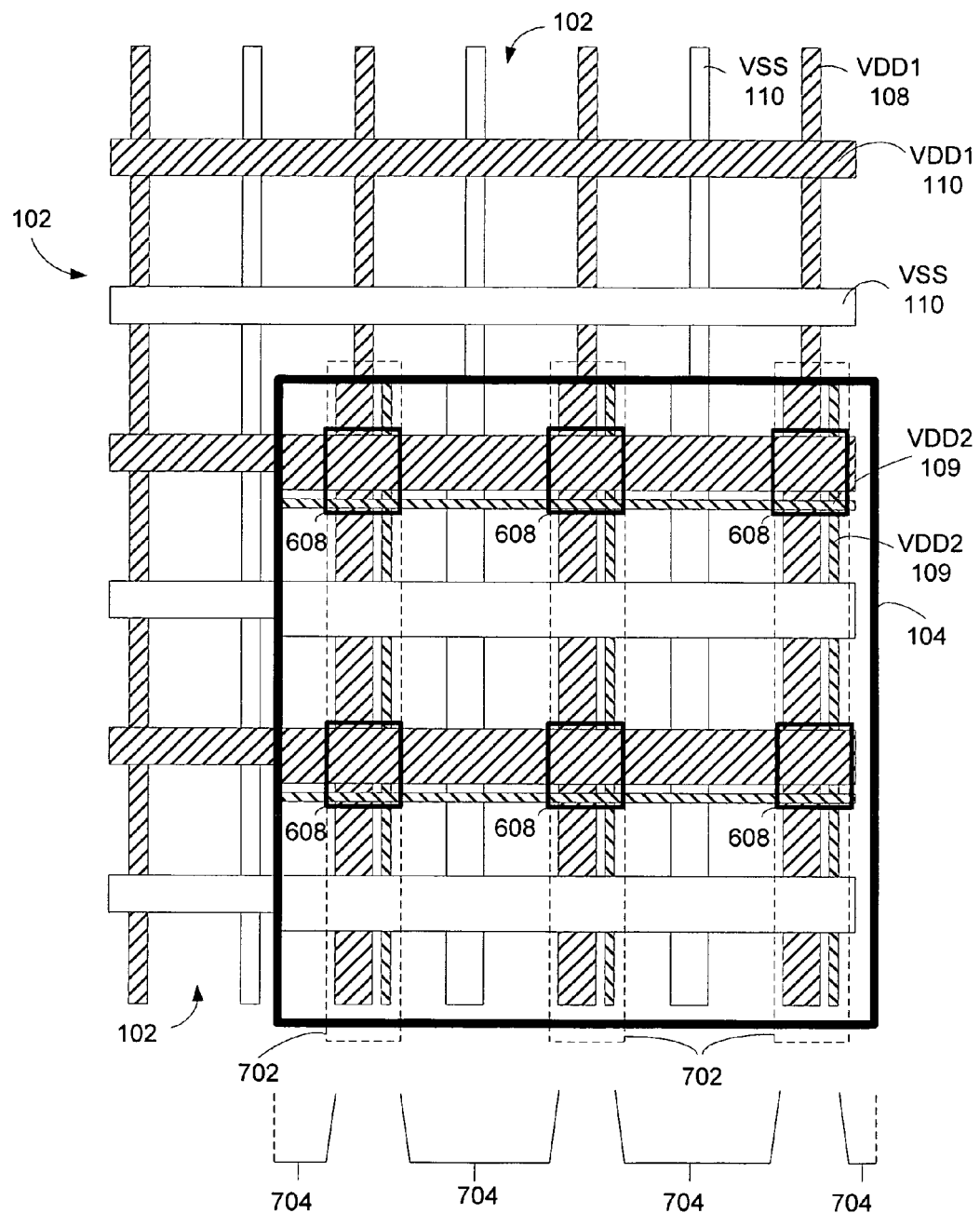
FIG. 7 illustrates a top plan view of a portion of an integrated circuit in accordance with one embodiment of the present disclosure.

FIG. 7 illustrates a top plan view 700 of one example of a portion of an integrated circuit such as integrated circuit 100 in accordance with one embodiment of the present disclosure. The top plan view 700 is similar to the top plan view 600 of FIG. 6 with common elements illustrated with common reference numerals. Further, areas 702 and 704 are meant to refer to the same or substantially the same region as defined by areas 606 and 609, respectively, of FIG. 6. It is further recognized that the pitch, i.e., the space between metals of the voltage supply grids, may vary than as illustrated in FIG. 7. In other words, the relative spacing between metals is not fixed and may be varied, as appreciated by one having ordinary skill in the art, without departing from the scope of the present disclosure. The same is true with respect to the pitch in FIGS. 8-10.

Returning to FIG. 7, any combination of buffer cells 400 and switching cells 200, 300 may be placed in area 702. In contrast to any of the prior art solutions described above, buffer cells 400 may be placed in space 704 to form buffer cell clusters, without the restraints of being associated with a switching cell, and non-buffer cells such as standard cells associated with the second voltage domain 104 may be placed elsewhere in space 104. Unlike the first and second prior art solutions, buffer cells are not precluded from being placed in the columns 606. Unlike the third prior art solution, pairs of switching cells 200, 300 are not needed or required and therefore do not create regions for the exclusive placement of buffer cells. As is recognized, this provides additional flexibility in the number of buffers 116 available and further provides greater usage of space 704 for other types of cells (e.g. standard cells).

Figure 8:
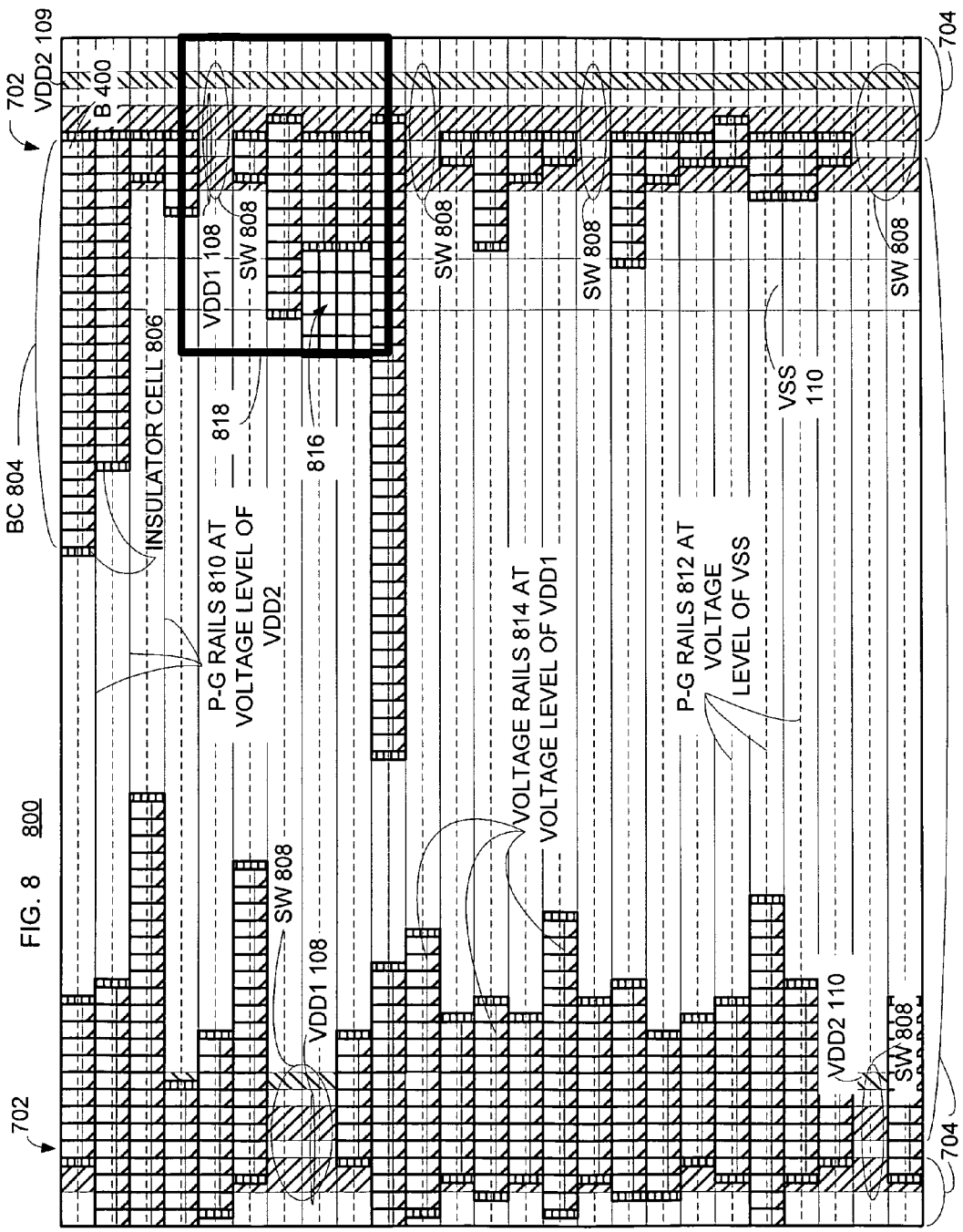
FIG. 8 illustrates a top plan view of a portion of the second voltage domain of the integrated circuit of FIG. 7 in accordance with one embodiment of the present disclosure.

FIG. 8 illustrates a top plan view of an exemplary portion 800 of the second voltage domain 104 of the integrated circuit of FIG. 7 and further shows the physical placement of cells in this portion 800 of the second voltage domain 104. The specific embodiment of FIG. 8 illustrates two substantially vertical and parallel metals of the positive voltage supply grid VDD1 108 (each of which is implemented using two metals), two substantially vertical and parallel metals of the selectably on voltage supply grid VDD2 109 and a substantially vertical metal of the negative voltage supply grid VSS 110. FIG. 8 also illustrates the placement of initial buffer cells 400 along the region defined by columns 702 of FIG. 7. Buffer cell clusters 804 are also illustrated and include the initial buffer cells 400 in columns 702 and may also, in one embodiment, include additional buffer cells 400 that are placed adjacent to and, in some instances, on either side of initial buffer cells 400 in columns 702. Each buffer cell cluster 804 has two distal ends. On each distal side or end of the buffer cell cluster 804 an insulator cell 806 is coupled thereto as part of the buffer cell cluster 804.

In the embodiment of FIG. 8, switching cells 200, 300 may be located in the regions having labels 808. FIG. 8 further illustrates a plurality of horizontal lines. Each of these horizontal lines represent: (1) a row boundary of the IC floor plan or layout; and (2) a power-ground rail. Power ground rails 810 are power-ground rails at the voltage level of the selectably on voltage supply grid VDD2 109. Power-ground rails 812 are power-ground rails at the voltage level of the negative voltage supply grid VSS 110. Although the power-ground rails are illustrated as spanning the entire portion 800 of the second voltage domain 104, it is recognized that the power-ground rails are only necessary to the extent cells requiring this voltage for operation are placed in these regions. FIG. 8 further illustrates voltage rail 814 at the voltage level of the positive voltage supply grid VDD1 108. Voltage rail 814 is the voltage rail used by the buffer cells 400 to convey the voltage of the positive voltage supply grid VDD1 108 from the initially-placed buffer cell 400 in column 802 to each other buffer cell 400 in the buffer cell clusters 804. Each of the power-ground rails 810, 812 and the voltage rail 814 are located in intermediate metal layers of the integrated circuit.

Implicit in the above discussion is that a variety of other cells may be located in portion 800 of the second voltage domain 104 of FIG. 8 (e.g., in space 704). This is made possible, in part, by the use of insulator cells 806 (as discussed below) and is in contrast to at least the third prior art solution. For instance a plurality of standard cells 816 are located in the segment 818 of the portion 800 of the integrated circuit. However, any number of standard cells and/or other cells may be located in a variety of other "empty" cell positions. As also illustrated in this embodiment, each of the standard cells 816 are single row height cells. Conversely, each of the buffer cells 400 and insulator cells 806 are double row height cells. Each of the cells in the portion 800 are located at the lower metal layers and the substrate layer. The integrated circuit components/elements of segment 818 are illustrated in further detail in FIG. 9.

Figure 9:
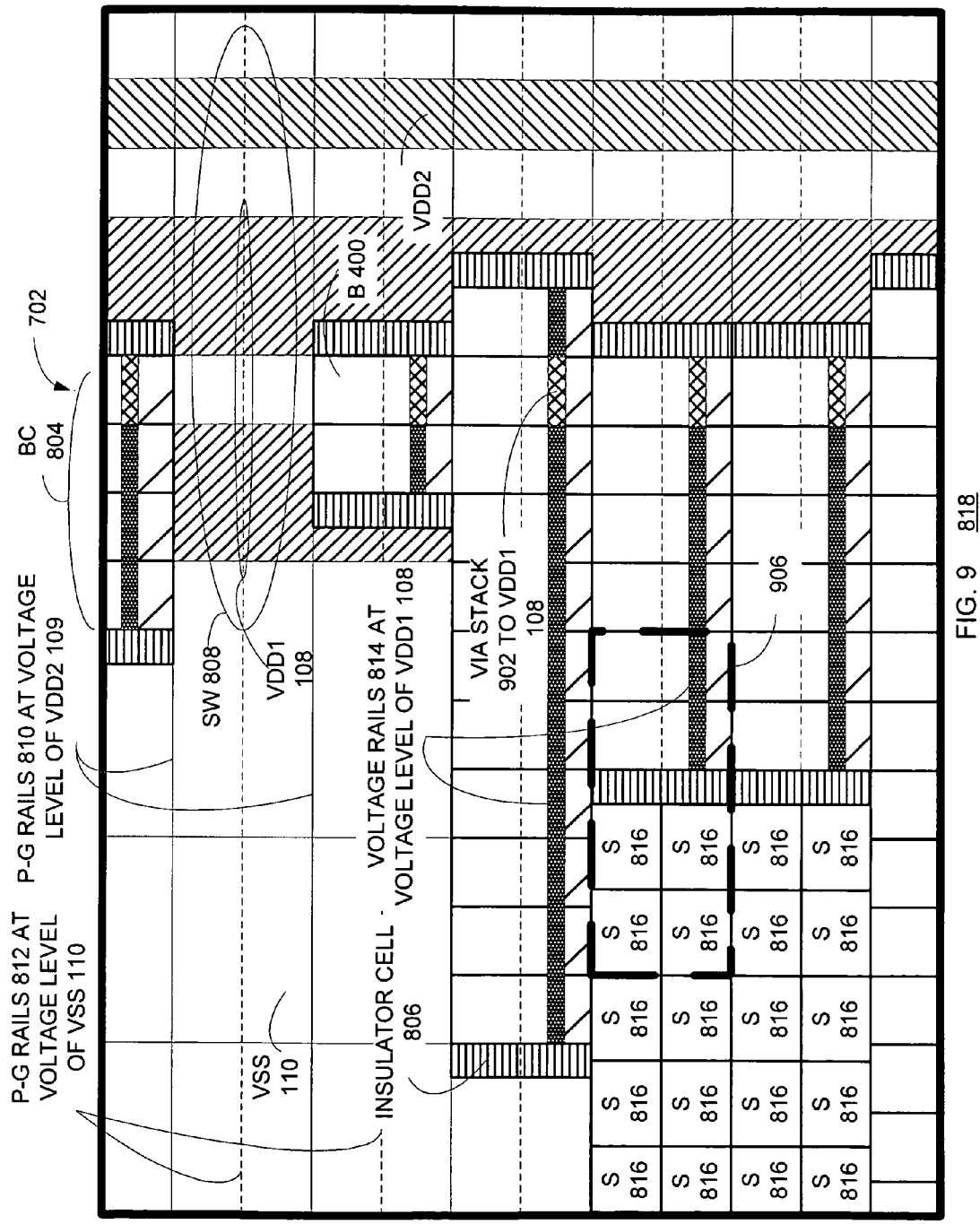
FIG. 9 illustrates an exploded top plan view of one segment of the portion of the integrated circuit of FIG. 8.

FIG. 9 illustrates an exploded top plan view of segment 818 of the portion 800 of the integrated circuit of FIG. 8. The exploded top plan view of segment 818 of FIG. 9 more clearly illustrates the plurality of standard cells S 816 in addition to via stacks 902 used to couple buffer cells 400 in columns 802 to the positive voltage supply grid VDD1 108. Each other buffer cell 400 in the buffer cell clusters 804 are coupled to the buffer cell 400 in the column 804 in such a manner as to form the voltage rails 814 at the voltage level of the positive voltage supply grid VDD1 108. Buffer logic 116 in each of the buffer cells 400 of buffer cell cluster 804 taps the voltage level of the positive voltage supply grid VDD1 108 from voltage rail 814 to buffer its associated feed-through signal 113. FIG. 9 further highlights a region 906 of segment 818. This region 906 is further discussed with reference to FIG. 10.

Figure 10:
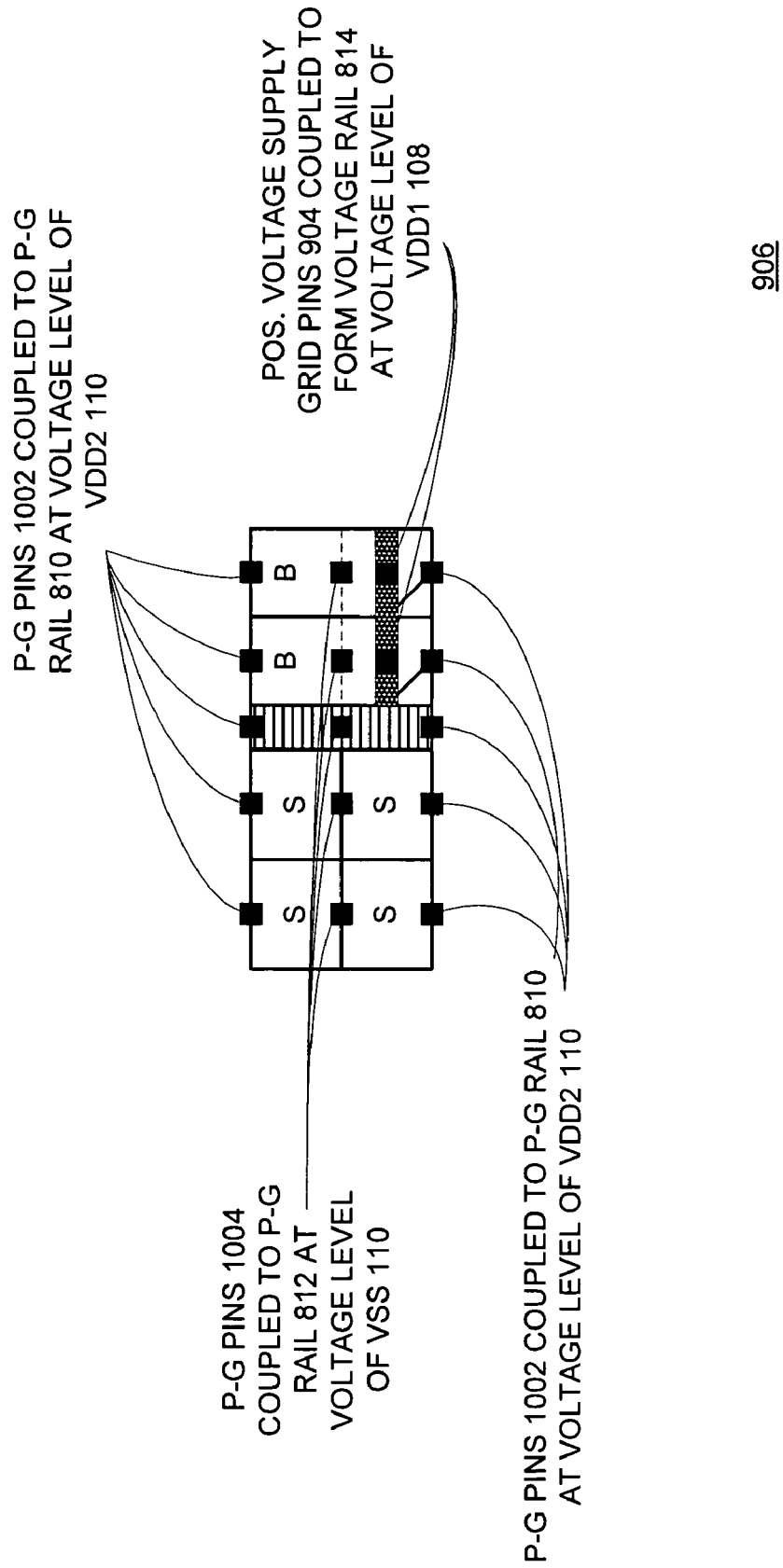
FIG. 10 illustrates a top plan view of region of the segment of the integrated circuit of FIG. 9 in further detail.

FIG. 10 illustrates a top plan view of region 906 of segment 818 of the portion of the integrated circuit of FIG. 9 in further detail. FIG. 10 more clearly illustrates an exemplary placement of the power-ground pins 1002 of each of the cells in region 906 that are coupled to the power-ground rails 810 at the voltage level of the selectably on positive voltage supply grid VDD2 110. An exemplary location of the power-ground pins 1004 of each of the cells in region 906 that are coupled to the power-ground rails 812 at the voltage level of the negative voltage supply grid VSS 110 is also provided. FIG. 10 also illustrates an exemplary placement of the positive voltage supply grid pins 904 of each of the buffer cells 400 that are coupled to form the voltage rail 814 at the voltage level of the positive voltage supply grid VDD1 108 for the buffer cell cluster. The insulator cell 806 located between the buffer cells 400 and the standard cells 816 is illustrated to show that it insulates voltage rail 814 from the remainder of the cells (e.g., the adjacent standard cells 816, which are powered by the selectably on voltage supply grid VDD2 109). In one embodiment, insulator cell 806 is any suitable insulating cell that performs this function such as an n-well cap cell as is known in the art.

Figure 11:
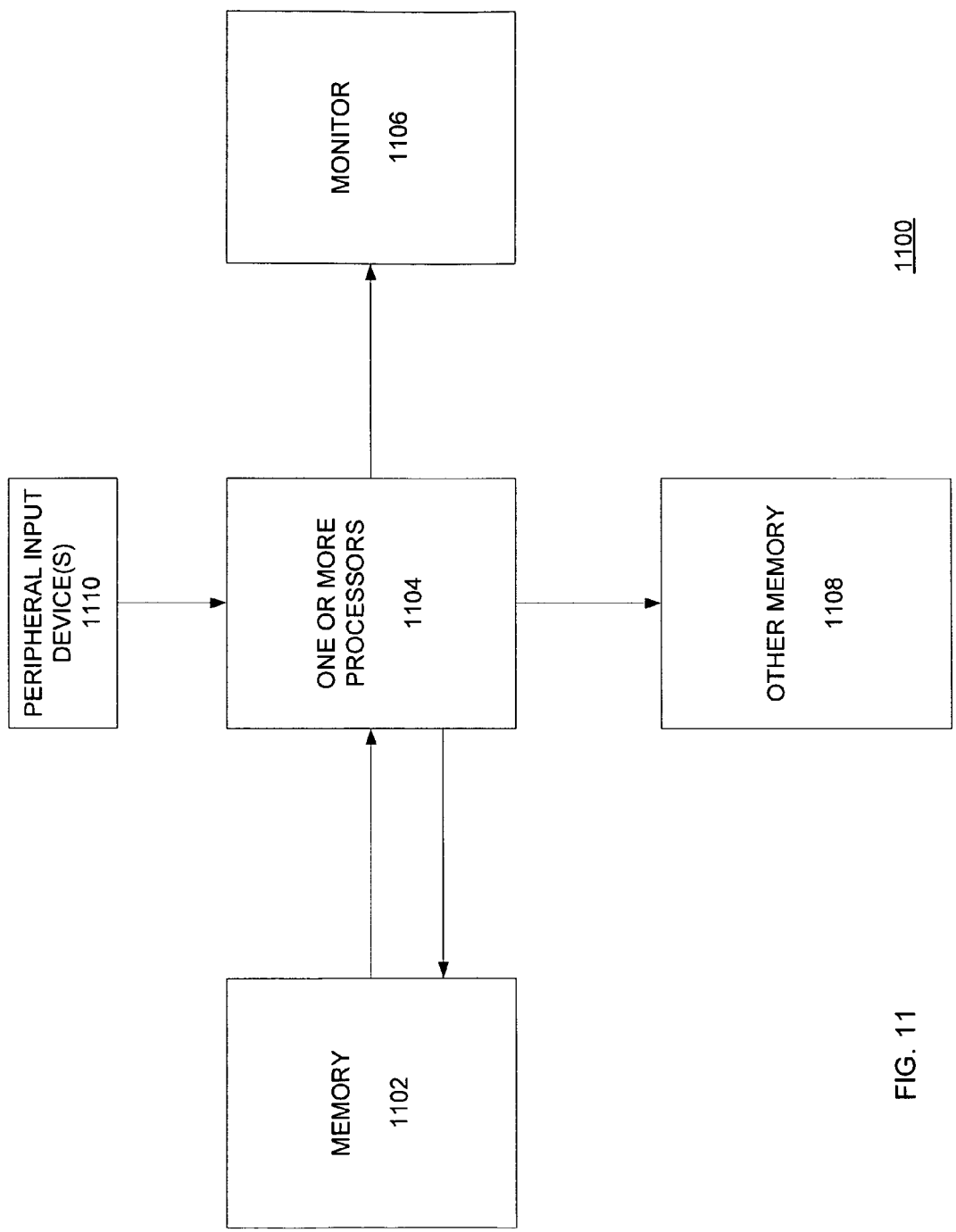
FIG. 11 illustrates a block diagram of a processing environment capable of executing instructions stored in memory in accordance with one embodiment of the present disclosure.

FIG. 11 illustrates a block diagram of processing environment 1100 capable of executing instructions stored in memory 1102 in accordance with one embodiment of the present disclosure. As is recognized, processing environment 1100 may be implemented using one or more integrated circuits. As shown, memory 1102 is coupled to one or more processors 1104. Memory 1102 may be any suitable volatile or non-volatile memory device or memory devices such as, but not limited to, system memory, frame buffer memory, flash memory, etc. In one embodiment, memory 1102 is a random access memory. The one or more processors 1104 may be any suitable processing device or devices having any number of processing cores such as, but not limited to, a microprocessor, microcontroller, digital signal processor, processing engine, hardware accelerator, or any combination thereof. In one embodiment, the one or more processors 1104 is coupled to monitor 1106, which is any device or devices capable of visually reproducing display information from the one or more processors 1104 such as, but not limited to, a CRT or a LCD display. In one embodiment, the one or more processors 1104 is coupled to other memory 1108, which may be any suitable volatile or non-volatile memory device or memory devices such as, but not limited to, system memory, frame buffer memory, flash memory, etc. In one embodiment, the one or more processors 1104 may be coupled to one or more peripheral input devices 1110 such as, but not limited to, a keyboard.

Memory 1102 includes executable instructions stored thereon that are capable of being executed by the one or more processors 1104 using known techniques. When the executable instructions from memory 1102 are executed by the one or more processors 1104, the one or more processors 1104 provide an integrated circuit layout that is capable of being used or followed to fabricate an integrated circuit such as the integrated circuit from FIGS. 7-10. In this manner, the executable instructions in memory 1102 may take the form of an IC design tool. As is appreciated, a variety of design parameters may be input for the design of a suitable integrated circuit to meet a designer's specific criteria. In one embodiment, the one or more processors 1104 stores the provided integrated circuit layout to one of the memory 1102 and the other memory 1108 for storage therein. For example, the layout may be stored in a frame buffer or may be stored on a suitable disc such as a CD-ROM. In one embodiment, the one or more processors 1104 may provide the integrated circuit layout to the monitor 1106 for display thereon.

Among other advantages, the above discussion enables an integrated circuit having multiple voltage domains to buffer more feed-through signals than prior art methodologies contemplated. In the embodiment where the first voltage domain is always on and the second voltage domain is selectably on, the buffers are said to be always on buffers because they are coupled to the positive voltage grid that is always on. It is recognized, that the above disclosure causes minimal routing impact for feed-though signals. That is, a circuit designer can place signal ports as close as possible to their destination without having to worry about routabililty through, e.g., a second voltage domain. Also, by using voltage rails 814 at the voltage level of VDD1 108, and by tapping it with an initial buffer cell 400 for distribution to the additional buffer cells 400 in each buffer cluster 804, the power is tapped minimally. It is recognized that the usage of the voltage rails 814 may be considered to be tapping power by abutment of adjacent buffer cells 400 in the buffer cluster 802. It is also recognized that the usage of insulator cells 806 such as n-well caps has a very small impact on the area of the buffer clusters in the integrated circuit.

The present disclosure allows multiple feed-through signals to cross the second voltage domain from the first voltage domain. The multiple feed-through signals cross the second domain through the use of always-on feed-through buffers. The first or initial buffer gets its power supply by tapping to the positive voltage supply grid. The adjacent buffers are simply abutted to the first buffer and through metal abutment these adjacent buffers will get the voltage supply. This avoids a need of locating the power grid and avoids the need of using multiple via taps from the main or positive voltage supply grid for the adjacent buffers.

It will also be recognized that the above description describes mere examples and that other embodiments are envisioned and covered by the appended claims. For example, it is recognized that power-ground rails 810 may be at the voltage level of the negative voltage supply grid VSS 110 while power-ground rails 812 may be at the voltage level of the selectably on voltage supply grid VDD2 109. In other words, the cell structure and power-ground pins 1002 and 1004 may vary so long as both VSS and VDD2 are provided to the cell as required. It is therefore contemplated that the present invention cover any and all modifications, variations or equivalents that fall within the spirit and scope of the basic underlying principles disclosed above and claimed herein.

What is claimed is:

1. An integrated circuit comprising:
   a switch operatively coupled to a selectably on voltage supply grid, the switch having a first node and a second node and operative to selectively turn on and off the selectably on voltage supply grid, the selectably on voltage supply grid operatively coupled to a positive voltage supply grid; and
   a buffer cell cluster operatively coupled to the selectably on voltage supply grid,
   wherein the buffer cell cluster comprises at least one initial buffer cell and a pair of insulator cells and is operatively coupled to the positive voltage supply grid, and wherein the at least one initial buffer cell is operative to buffer a feed-through signal having an activation voltage level defined substantially at the voltage level of the positive voltage supply grid.

2. The integrated circuit of claim 1, further comprising a switching cell, wherein the switching cell comprises the switch that is operative to selectively turn on and off the selectably on voltage supply gird, wherein the voltage level associated with the selectably on voltage supply grid is substantially at the voltage level associated with the positive voltage supply grid when the switch is on.

3. The integrated circuit of claim 1, further comprising:
   a first plurality of standard cells associated with the positive voltage supply grid, wherein the plurality of standard cells includes a transmitting standard cell operative to generate the feed-through signal, and
   a second plurality of standard cells associated with the selectably on voltage supply grid.

4. The integrated circuit of claim 3, further comprising:
   a negative voltage supply grid operative to supply the negative voltage level to the plurality of standard cells associated in the positive and selectably on voltage supply grids,
   wherein each buffer cell of the buffer cell cluster is operatively coupled between the positive voltage supply grid and the negative voltage supply grid.

5. The integrated circuit of claim 4, wherein:
   at least a layer of the selectably on voltage supply grid overlaps at least a layer of the positive voltage supply grid, and
   at least a layer of the negative voltage supply grid overlaps both a layer of the positive voltage supply grid and a layer of the selectably on voltage supply grid.

6. The integrated circuit of claim 3, wherein the plurality of standard cells associated with the positive voltage supply grid further includes a plurality of additional transmitting standard cells operative to generate a plurality of additional feed-through signals having an activation voltage level defined substantially at the voltage level of the positive voltage supply grid.

7. The integrated circuit of claim 1, wherein:
   the buffer cell cluster has two distal ends,
   the buffer cell cluster, at the first distal end, is operatively coupled to a first insulator cell of the pair of insulator cells, and
   the buffer cell cluster, at the second distal end, is operatively coupled to a second insulator cell of the pair of insulator cells.

8. The integrated circuit of claim 6, wherein:
   the buffer cell cluster includes at least one additional buffer cell,
   the initial buffer cell of the buffer cell cluster includes a positive voltage supply grid pin operatively coupled to the positive voltage supply grid through a via stack, and
   each additional buffer cell of the buffer cell cluster has a positive voltage supply grid pin operatively coupled to the positive voltage supply grid pin of the initial buffer cell and to each other positive voltage supply grid pin of each additional buffer cell of the buffer cell cluster such that the operatively coupled positive voltage supply grid pins of the buffer cell cluster form a voltage rail at the voltage level of the positive voltage supply grid.

9. The integrated circuit of claim 1, wherein:
   the positive voltage supply grid comprises a first plurality of metals and a second plurality of metals, wherein:
      each metal of the plurality of metals is substantially parallel to each other metal in the first plurality of metals,
      each metal of the second plurality of metals is substantially parallel to each other metal in the second plurality of metals and is substantially orthogonal to and in a different plane than each metal of the first plurality of metals, and
      each of the metals of the first and second pluralities of metals is operatively designated to provide the voltage associated with the positive voltage supply grid; and
   the selectably on voltage supply grid comprises a plurality of third plurality of metals and a fourth plurality of metals, wherein:
      each metal of the third plurality of metals is substantially parallel to each other metal in the third plurality of metals,
      each metal of the fourth plurality of metals is substantially parallel to each other metal in the fourth plurality of metals and is substantially orthogonal to and in a different plane than each metal of the third plurality of metals, and each of the pluralities of metals of the third and fourth pluralities of metals is operatively designated to provide the voltage associated with the selectably on voltage supply grid.

10. The integrated circuit of claim 3, wherein:

the buffer cell cluster has two distal ends, the buffer cell cluster, at the first distal end, is operatively coupled to a first insulator cell of the pair of insulator cells, and the buffer cell cluster, at the second distal end, is operatively coupled to a second insulator cell of the pair of insulator cells;

the integrated circuit further comprises:
   a plurality of power-ground rails at the voltage level of the selectably on voltage supply grid; and
   a plurality of power-ground rails at the voltage level of a negative voltage supply grid;

each of the plurality of standard cells associated with the selectably on voltage supply grid are single row height cells having a first power-ground pin and a second power-ground pin, each buffer cell in the buffer cell cluster and each insulator cell are double row height cells and have the first power-ground pin, the second power-ground pin and a third power ground pin, each first power-ground pin of the plurality of standard cells associated with the selectably on voltage supply grid, each buffer cell of the buffer cell cluster and each insulator cell are operatively coupled to one of the plurality of power-ground rails at the voltage level of the selectably on voltage supply grid, each second power-ground pin of the plurality of standard cells associated with the selectably on voltage supply grid of the integrated circuit, each buffer cell of the buffer cell cluster and each insulator cell are operatively coupled to one of the plurality of power-ground rails at the voltage level of the negative voltage supply grid, and each third power-ground pin of each buffer cell of the buffer cell cluster and each insulator cell are operatively coupled to another one of the plurality of power-ground rails at the voltage level of the selectably on voltage supply grid, or are operatively coupled to another one of the plurality of power-ground rails at the voltage level of the negative voltage supply grid.

11. The integrated circuit of claim 1, further comprising:

a first voltage domain associated with the positive voltage supply gird;

a second voltage domain associated with the selectably on voltage supply grid;

a third voltage domain associated with the positive voltage supply grid; and a plurality of standard cells associated with the third voltage domain and operatively powered by the positive voltage supply grid, wherein the plurality of standard cells includes a receiving standard cell operative to receive the feed-through signal, wherein one of the buffer cells of the buffer cell cluster is further operative to transmit the buffered feed-through signal to the receiving standard cell.

12. The integrated circuit of claim 2, wherein:

the switch comprises a plurality of switches, the switching cell comprises a plurality of switching cells, and each of the plurality of switching cells comprises a respective one of the plurality of switches.

13. An integrated circuit comprising:

a third voltage domain associated with a positive voltage supply grid;

a switch operatively coupled to a selectably on voltage supply grid, the switch having a first node and a second node and operative to selectively turn on and off the selectably on voltage supply grid;

a plurality of standard cells associated with a first voltage domain and operatively powered by the positive voltage supply grid, wherein the plurality of standard cells includes a plurality of transmitting standard cells each operative to generate a corresponding feed-through signal having an activation voltage level defined substantially at the voltage level of the positive voltage supply grid;

a buffer cell cluster comprising at least one initial cell and a pair of insulator cells, wherein the buffer cell cluster is coupled to the positive voltage supply grid, and wherein the at least one initial buffer cell is operative to buffer at least one feed-through signal generated by the plurality of transmitting standard cells;

a plurality of standard cells associated with the second voltage domain operatively powered by the selectably on voltage supply grid; and a plurality of standard cells associated with the third voltage domain and operatively powered by the positive voltage supply grid, wherein the plurality of standard cells includes a plurality of receiving standard cells each operative to receive one buffered feed-through signal.

14. The integrated circuit of claim 13, wherein:

the buffer cell cluster has two distal ends, the buffer cell cluster, at the first distal end, is operatively coupled to a first insulator cell of the pair of insulator cells, and the buffer cell cluster, at the second distal end, is operatively coupled to a second insulator cell of the pair of insulator cells.

15. Memory comprising executable instructions capable of being executed by one or more processors such that, when the executable instructions are executed by the one or more processors, the executable instructions cause the one or more processors to:

provide an integrated circuit layout; and store the integrated circuit layout in one of: the memory and other memory capable of being accessed by the one or more processors, wherein the integrated circuit layout is capable of being used to fabricate an integrated circuit that comprises:
   a switch operatively coupled to a selectably on voltage supply grid, the switch having a first node and a second node and operative to selectively turn on and off the selectably on voltage supply grid, the selectably on voltage supply grid operatively coupled to a positive voltage supply grid; and
   a buffer cell cluster operatively coupled to the selectably on voltage supply grid,
   wherein the buffer cell cluster comprises at least one initial buffer cell and a pair of insulator cells and is operatively coupled to the positive voltage supply grid, and wherein the at least one initial buffer cell is operative to buffer a feed-through signal having an activation voltage level defined substantially at the voltage level of the positive voltage supply grid.

16. The memory of claim 15, wherein the executable instructions further cause the one or more processors to display the integrated circuit layout on a monitor that is operatively coupled to the one or more processors.

17. The memory of claim 15, wherein the integrated circuit further comprises:
   a plurality of standard cells associated with the positive voltage supply grid, wherein the plurality of standard cells includes a transmitting standard cell operative to generate the feed-through signal, and
   a plurality of standard cells associated with the selectably on voltage supply grid.

18. The memory of claim 17, wherein the integrated circuit further comprises:
   a negative voltage supply grid operative to supply the negative voltage level to the plurality of standard cells associated in the positive and selectably on voltage supply grids,
   wherein each buffer cell of the buffer cell cluster is operatively coupled between the positive voltage supply grid and the negative voltage supply grid.

19. The memory of claim 18, wherein:
   the selectably on voltage supply grid overlaps at least a portion of the positive voltage supply grid, and
   the negative voltage supply grid overlaps both the positive voltage supply grid and the selectably on voltage supply grid.

20. The memory of claim 17, wherein the plurality of standard cells associated with the positive voltage supply grid further includes a plurality of additional transmitting standard cells operative to generate a plurality of additional feed-through signals having an activation voltage level defined substantially at the voltage level of the positive voltage supply grid.

21. The memory of claim 15, wherein:
   the buffer cell cluster has two distal ends,
   the buffer cell cluster, at the first distal end, is operatively coupled to a first insulator cell of the pair of insulator cells, and
   the buffer cell cluster, at the second distal end, is operatively coupled to a second insulator cell of the pair of insulator cells.

22. The memory of claim 20, wherein:
   the buffer cell cluster includes at least one additional buffer cell,
   the initial buffer cell of the buffer cell cluster includes a positive voltage supply grid pin operatively coupled to the positive voltage supply grid through a via stack, and
   each additional buffer cell of the buffer cell cluster has a positive voltage supply grid pin operatively coupled to the positive voltage supply grid pin of the initial buffer cell and to each other positive voltage supply grid pin of each additional buffer cell of the buffer cell cluster such that the operatively coupled positive voltage supply grid pins of the buffer cell cluster form a voltage rail at the voltage level of the positive voltage supply grid.

23. The memory of claim 15, wherein:
   the positive voltage supply grid comprises a first plurality of metals and a second plurality of metals, wherein:
      each metal of the plurality of metals is substantially parallel to each other metal in the first plurality of metals,
      each metal of the second plurality of metals is substantially parallel to each other metal in the second plurality of metals and is substantially orthogonal to and in a different plane than each metal of the first plurality of metals, and
      each of the metals of the first and second pluralities of metals is operatively designated to provide the voltage associated with the positive voltage supply grid; and
   the selectably on voltage supply grid comprises a plurality of third plurality of metals and a fourth plurality of metals, wherein:
      each metal of the third plurality of metals is substantially parallel to each other metal in the third plurality of metals,
      each metal of the fourth plurality of metals is substantially parallel to each other metal in the fourth plurality of metals and is substantially orthogonal to and in a different plane than each metal of the third plurality of metals, and
   each of the pluralities of metals of the third and fourth pluralities of metals is operatively designated to provide the voltage associated with the selectably on voltage supply grid.

24. The memory of claim 17, wherein:
   the buffer cell cluster has two distal ends,
   the buffer cell cluster, at the first distal end, is operatively coupled to a first insulator cell, of the pair of insulator cells and
   the buffer cell cluster, at the second distal end, is operatively coupled to a second insulator cell of the pair of insulator cells;
   the integrated circuit further comprises:
      a plurality of power-ground rails at the voltage level of the selectably on voltage supply grid; and
      a plurality of power-ground rails at the voltage level of a negative voltage supply grid;
   each of the plurality of standard cells associated with the selectably on voltage supply grid are single row height cells having a first power-ground pin and a second power-ground pin,
   each buffer cell in the buffer cell cluster and each insulator cell are double row height cells and have the first power-ground pin, the second power-ground pin and a third power ground pin,
   each first power-ground pin of the plurality of standard cells associated with the selectably on voltage supply grid, each buffer cell of the buffer cell cluster and each insulator cell are operatively coupled to one of the plurality of power-ground rails at the voltage level of the selectably on voltage supply grid,
   each second power-ground pin of the plurality of standard cells associated with the second voltage domain of the integrated circuit, each buffer cell of the buffer cell cluster and each insulator cell are operatively coupled to one of the plurality of power-ground rails at the voltage level of the negative voltage supply grid, and
   each third power-ground pin of each buffer cell of the buffer cell cluster and each insulator cell are operatively coupled to another one of the plurality of power-ground rails at the voltage level of the selectably on voltage supply grid, or are operatively coupled to another one of the plurality of power-ground rails at the voltage level of the negative voltage supply grid.

25. The memory of claim 15, wherein the integrated circuit further comprises:
   a first voltage domain associated with the positive voltage supply grid;
   a second voltage domain associated with the selectably on voltage supply grid;
   a third voltage domain associated with the positive voltage supply grid; and a plurality of standard cells associated with the third voltage domain and operatively powered by the positive voltage supply grid, wherein the plurality of standard cells includes a receiving standard cell operative to receive the feed-through signal, wherein one of the buffer cells of the buffer cell cluster is further operative to transmit the buffered feed-through signal to the receiving standard cell.

* * * * *